(12) United States Patent
Fievet et al.

(10) Patent No.: US 7,994,866 B2
(45) Date of Patent: Aug. 9, 2011

(54) AUTO TRIMMING OSCILLATOR

(75) Inventors: Sebastien Fievet, Aix en Provence (FR); Michel Cuenca, Septemes-les-Vallons (FR)

(73) Assignee: Atmel Corporation, San Jose, CA (US)

( * ) Notice: Subject to any disclaimer, the term of this patent is extended or adjusted under 35 U.S.C. 154(b) by 96 days.

(21) Appl. No.: 12/245,119

(22) Filed: Oct. 3, 2008

(65) Prior Publication Data
US 2010/0085121 A1 Apr. 8, 2010

(51) Int. Cl.
*H03L 7/085* (2006.01)
(52) U.S. Cl. .......................................... 331/1 A; 331/25
(58) Field of Classification Search ...................... 331/25, 331/135
See application file for complete search history.

(56) References Cited

U.S. PATENT DOCUMENTS

| 4,272,729 | A |   | 6/1981  | Riley, Jr. |
| 4,531,102 | A | * | 7/1985  | Whitlock et al. ............. 331/1 A |
| 4,855,683 | A | * | 8/1989  | Troudet et al. ................ 327/159 |
| 5,696,468 | A |   | 12/1997 | Nise |
| 6,242,956 | B1|   | 6/2001  | McCollough et al. |
| 2003/0048139 | A1 | * | 3/2003 | Chien et al. .................... 331/11 |
| 2007/0296509 | A1 |   | 12/2007 | Yang et al. |

* cited by examiner

*Primary Examiner* — Joseph Chang
(74) *Attorney, Agent, or Firm* — Fish & Richardson P.C.

(57) ABSTRACT

An auto trimming oscillator includes a Successive Approximation Register (SAR), a frequency detector and an n-bit comparator. The SAR is used to iteratively trim the oscillator output clock frequency based on a difference between a reference clock frequency and the oscillator output clock frequency. The oscillator is trimmed to deliver a clock frequency which is a closest match to the reference clock frequency.

9 Claims, 4 Drawing Sheets

AUTO TRIMMING OSCILLATOR

TECHNICAL FIELD

This subject matter relates generally to electronic circuits, and more particularly to trimming oscillator circuits.

BACKGROUND

Many modern electronic circuits (e.g., microcontrollers) use internal CMOS oscillators to generate clocks. In many applications, a low variation CMOS oscillator is needed. Conventional CMOS oscillators are manually trimmed by test engineers with dedicated, external tester resources. Some CMOS oscillators use a resistive-capacitive (RC) structure.

A conventional RC oscillator with a Schmitt trigger is shown in FIG. 1A. The RC oscillator 100 includes a capacitor 102 (C), a Schmitt trigger 104 (11) and a resistor 106 (R). The output clock 108 has a frequency that is directly proportional to the RC product. A typical integrated poly-silicon resistor can provide a relative frequency variation of about +/−25% and a typical integrated CMOS capacitor can provide a relative frequency variation of about +/−15%. In this case, the overall relative frequency variation can have a +/−40% total frequency variation. Even using other RC oscillator topologies (e.g., charging and discharging an internal capacitor with controlled current, etc.) it is not easy to find a solution where the frequency does not directly depend on the RC product. Thus, the oscillator frequency directly depends on process distribution which can cause values for the resistor and capacitor to vary. One common technique for reducing RC oscillator variation is to use trimming bits to trim the resistor and/or the capacitor to compensate for process variation.

FIG. 1B illustrates a conventional RC oscillator 110 that uses trimming bits Dn, . . . , D0 to trim the resistor 106 using, for example, a binary-weighted resistive network. Depending on the digital code set on the resistive network, the oscillator frequency can be increased, decreased or maintained. In this example, the first digital code produces clock 112 (CodeA) and a second digital code produces code 114 (CodeB). FIG. 2 shows an example frequency variation F0-F4 obtained using digital codes 1-5.

SUMMARY

An auto trimming oscillator includes a Successive Approximation Register (SAR), a frequency detector and an n-bit comparator. The SAR is used to iteratively trim the oscillator based on a difference between the oscillator frequency and a reference frequency. The oscillator is trimmed to deliver a clock having a frequency which substantially matches the reference frequency.

Some advantages of the disclosed auto trimming oscillator include but are not limited to: fast and accurate determination of oscillator trimming values, low cost fabrication (small area), and a robust, fully digital, built-in solution that can free test resources during production tests.

DETAILED DESCRIPTION

Example Auto Trimming Oscillator

Figure 1A:
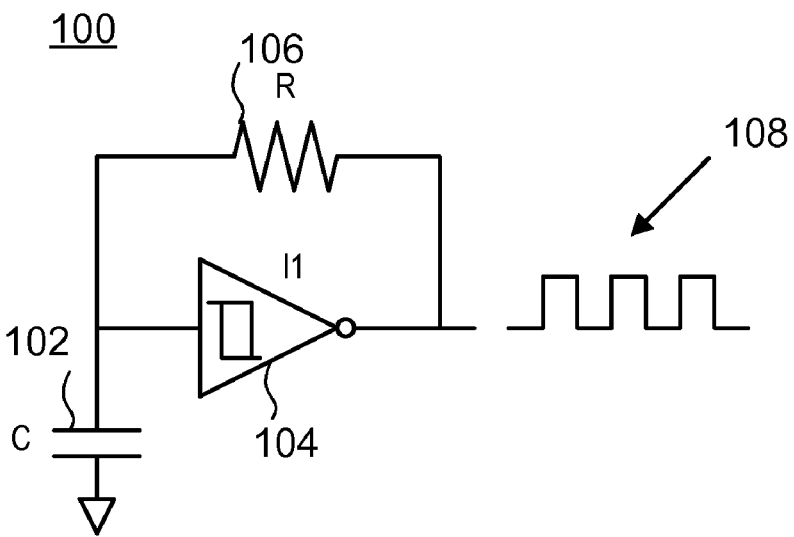
FIG. 1A is a schematic diagram of a conventional RC oscillator using a Schmitt trigger.
Figure 1B:
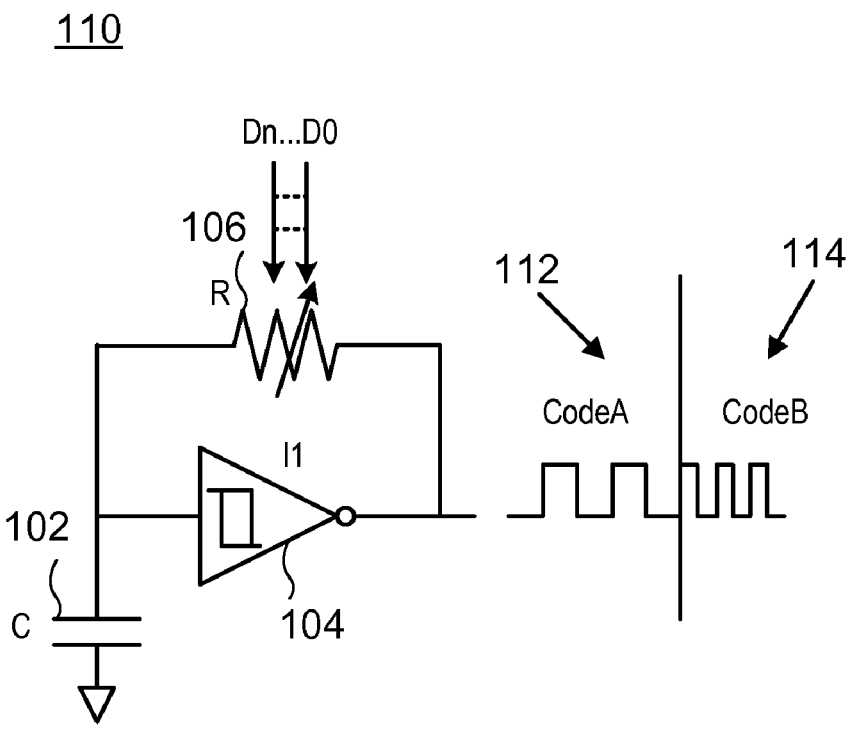
FIG. 1B is a schematic diagram of the RC oscillator of FIG. 1A using trimming bits on the resistor.
Figure 3:
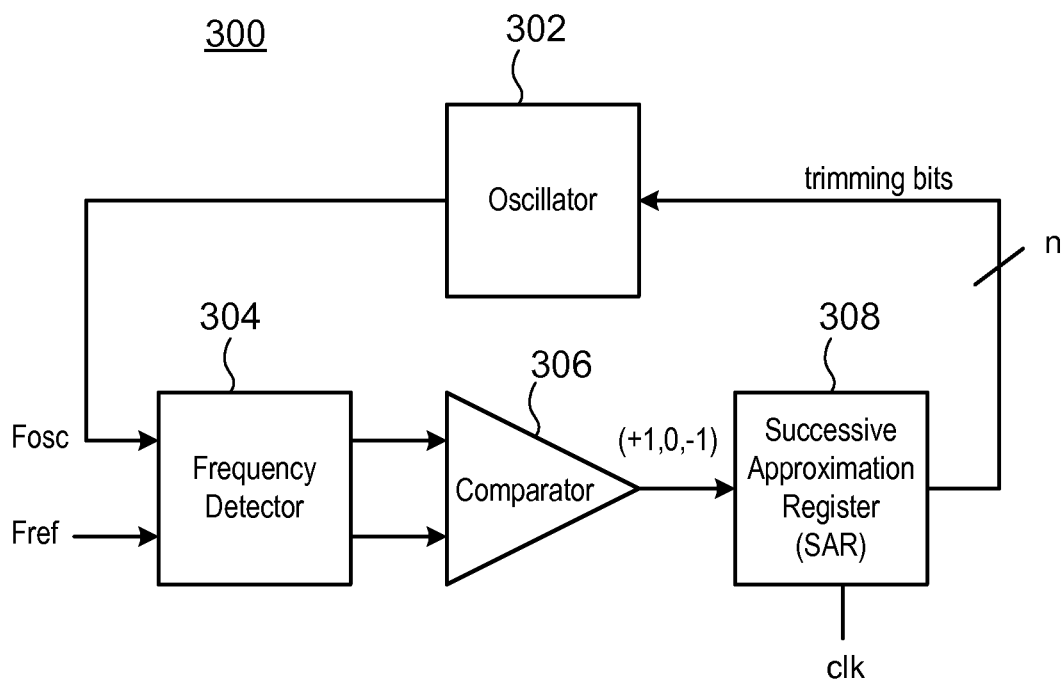
FIG. 3 is a block diagram of an example auto trimming oscillator using a Successive Approximation Register (SAR).

FIG. 3 is a block diagram of an example auto trimming oscillator using a SAR. In some implementations, an auto trimming oscillator 300 can include an oscillator 302, a frequency detector 304, a comparator 306 and a SAR 308. In the example configuration shown, the SAR 308 outputs a digital code that can be used to iteratively trim the oscillator 302 based on a difference between the oscillator 302 frequency (Fosc) and a reference clock frequency (Fref). In some implementations, the oscillator 302 can be a conventional RC oscillator, such as the RC oscillator 110 shown in FIG. 1B. Other types of oscillators can also be used (e.g., Wien Bridge, Twin-T, phase-shift).

Figure 2:
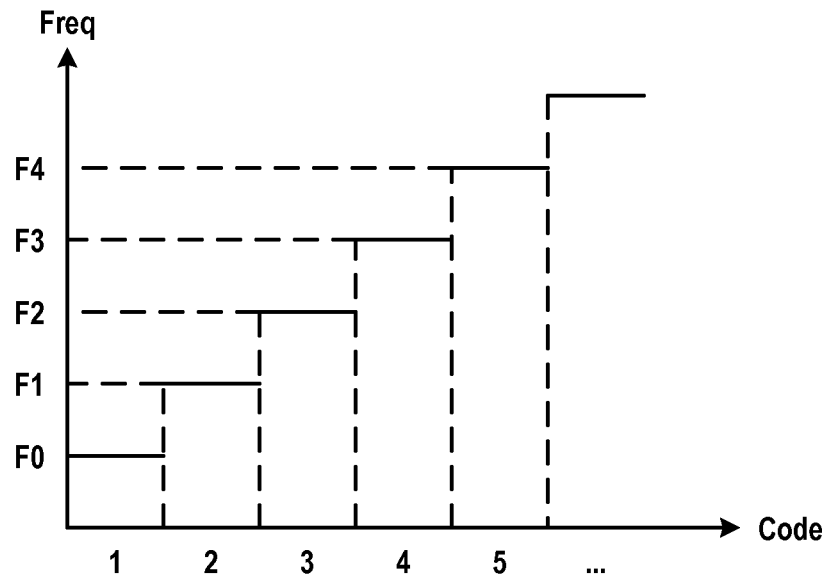
FIG. 2 is a graph of frequency versus digital code.

In some implementations, the frequency detector 304 counts the number of edges of both the oscillator 302 clock and the reference clock for a period of time T defined in reference to FIG. 2 by:

$$T = \text{Minimum}[1/(F(i)-F(i-1))]], i < 2^n - 1,$$

where n=number of trimming bits and F(i)=output frequency of oscillator 302 for code i.

Figure 4:
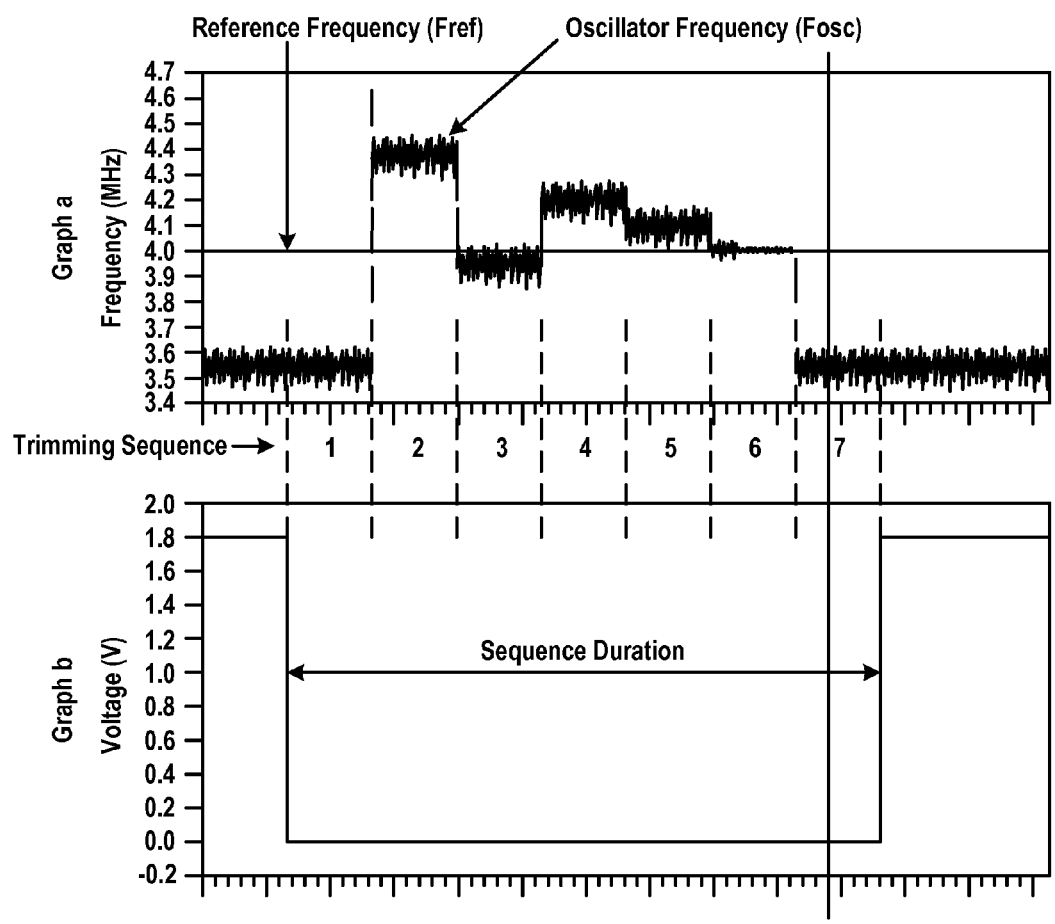
FIG. 4 are graphs illustrating an example oscillator trimming sequence for use with the auto trimming oscillator of FIG. 3.

The trimming sequence is described in reference to FIG. 4. This period of time T can be adjustable. Other types of frequency detectors can also be used to compare the oscillator frequency to the reference frequency.

The comparator 306 (e.g., a 1.5 bit comparator) determines from an output of the frequency detector 304 if the oscillator 302 is faster, slower or the same as the reference clock. Using a 1.5 bit comparator rather than a 1 bit comparator improves the trimming accuracy by half a bit.

The SAR 308 receives the comparator 306 output (e.g., +1, 0, −1) at each step of the trimming sequence, thus building up a digital code in the SAR 308 that can be applied to trimming circuitry in the oscillator 302 to adjust the oscillator 302 frequency to match or substantially match the reference frequency. The use of the SAR 308 to close a feedback loop with the oscillator 302 improves the speed of the trimming sequence. If the oscillator 302 is an RC oscillator, then the digital code can be used to adjust a resistor and/or capacitor value, which, in turn, adjusts the frequency of the oscillator 302. In some implementations, the resistor of the oscillator 302 (e.g., resistor 106) can be adjusted using an n-bit (e.g., 7-bit digital code) binary-weighted resistor network. In other implementations, the capacitor (e.g., capacitor 102) can be trimmer capacitor which is responsive to digital codes. Various know techniques can be used to implement a resistive network or tripper capacitor that is response to a digital code.

Table I below illustrates an example trimming sequence for providing a 7-bit SAR output code. At Step 0 (initialization), the SAR output code is set to midrange: 1000000.

TABLE I

Example Trimming Sequence

| Step | Frequency Detector | Comparator | SAR Output |
|---|---|---|---|
| 1 | Fosc < Fref | +1 | 1100000 |
| 2 | Fosc > Fref | −1 | 1010000 |
| 3 | Fosc < Fref | +1 | 1011000 |

TABLE I-continued

Example Trimming Sequence

| Step | Frequency Detector | Comparator | SAR Output |
|------|--------------------|------------|------------|
| 4 | Fosc > Fref | −1 | 1010100 |
| 5 | Fosc > Fref | −1 | 1010010 |
| 6 | Fosc = Fref | 0 | 1010010 |

Thus, at the end of the sequence, the trimming code found by the SAR will be 1010010.

Example Trimming Sequence

FIG. 4 includes graphs illustrating the example trimming sequence shown in Table I. In this example, the auto trimming oscillator 300 shown in FIG. 3 has been synthesized using a 0.15 um CMOS process. The reference frequency (Fref) is 4 MHz and the SAR 308 provides 7 trimming bits (e.g., 7-bit digital codes).

Graphs "a" and "b" illustrate an example trimming sequence for providing the digital code necessary for the oscillator 302 to compensate for process variation. More particularly, graph "a" represents the frequency of the oscillator 302 versus time and Graph "b" is a digital bit (also referred to as the "eot signal") that controls the overall trimming sequence duration. Graph "a" shows a 7 step trimming sequence where the reference frequency is about 4 MHz and the oscillator frequency is about 3.5 MHz. The auto trimming sequence starts when the eot signal (Graph "b") goes low.

At step 0, Fosc is initialized by a trimming code representing a midrange value of the Fosc frequency range (e.g., 1000000). At step 1, Fref>Fosc, so the trimming code is increased to raise Fosc (e.g., 1100000). At step 2, Fosc>Fref, so the trimming code is decreased to lower Fosc (e.g., 1010000). At steps 3, 4, 5 and 6, the successive approximation technique attempts to substantially match (e.g., as close as possible) Fosc to Fref. After step 6, Fosc is reset to its midrange value of step 0. At the end of the trimming sequence, which corresponds to the rising of the eot signal, the digital code (trimming code) is available on the output of the SAR 308. The trimming code can be applied to a binary-weighted resistor network and/or other trimming circuit (e.g., a trimmer capacitor) in the oscillator 302 to adjust the oscillator 302 frequency to substantially match the reference frequency.

Figure 5:
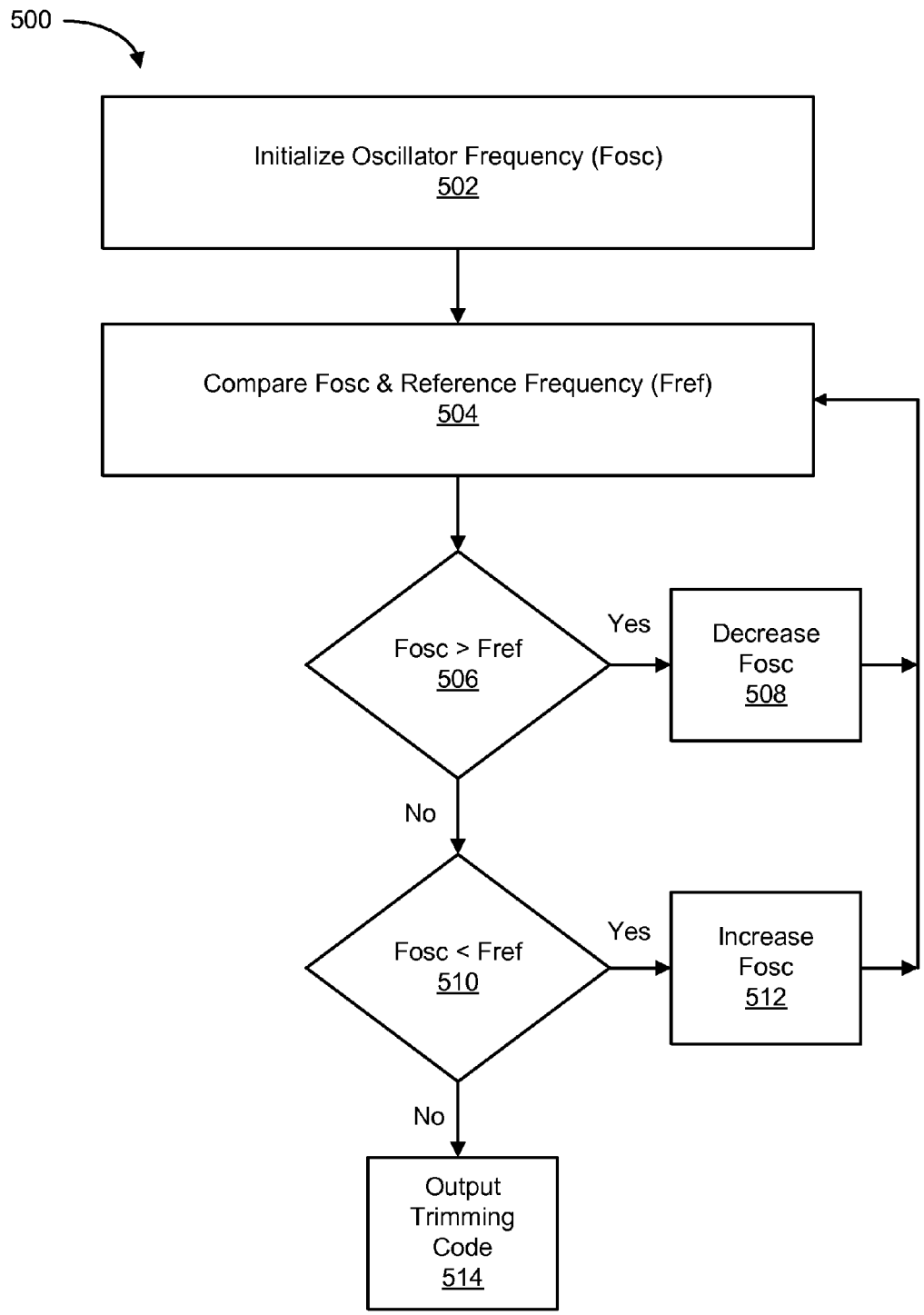
FIG. 5 is a flow diagram illustrating an example trimming sequence.

FIG. 5 is a flow diagram illustrating an example trimming sequence 500. The sequence 500 begins when the oscillator frequency (Fosc) is initialized (502). In some implementations, the Fosc can be set to a midrange frequency. Fosc is compared to a reference frequency (Fref) (504). The comparison can be made using a frequency detector (e.g., frequency detector 304) coupled to a comparator (e.g., comparator 306). If Fosc>Fref (506), then Fosc is decreased (508). If Fosc<Fref (510), then Fosc is increased (512). Fosc can be increased or decreased using a digital code output by a SAR (e.g., SAR 308) using the circuit and techniques described in reference to FIGS. 3 and 4. If Fosc matches or substantially matches Fref, the digital code is output as a trimming code (514). The trimming code can be applied to a trimming circuit in the oscillator, such as a binary-weighted resistive network or a trimmer capacitor to adjust Fosc to match or substantially match Fref.

What is claimed is:

1. A device comprising:
   an oscillator;
   a frequency detector coupled to the oscillator and operable for comparing the oscillator frequency with a reference frequency and for generating a first output signal based on a result of the comparison;
   a comparator coupled to the frequency detector and operable for generating three different types of comparator output signals based on the first output signal, including a first comparator output signal indicating that the oscillator frequency is faster than the reference frequency, a second comparator output signal indicating that the oscillator frequency is slower than the reference frequency, and a third comparator output signal indicating that the oscillator frequency is substantially the same as the reference frequency; and
   a Successive Approximation Register (SAR) coupled to the comparator and operable for providing one or more digital codes for trimming the oscillator based on whether the oscillator frequency is faster, slower or substantially the same as the reference frequency.

2. The device of claim 1, where the digital code is used to trim a resistor or a capacitor in the oscillator, and where the resistor or capacitor determine at least in part the oscillator frequency.

3. The device of claim 1, where the resistor is varied by the digital codes using a binary-weighted resistor network.

4. The device of claim 1, where the capacitor is varied by the digital codes using a trimmer capacitor.

5. The device of claim 1, where the comparator is a 1.5 bit comparator.

6. The device of claim 1, where the digital code is a 7-bit digital code.

7. A method of automatically trimming an oscillator using successive approximation, comprising:
   (a) setting a first oscillator frequency based on a first digital code;
   (b) comparing the oscillator frequency with a reference frequency;
   determining that the oscillator frequency is less than the reference frequency, and in response to the determining:
   (c) generating a second digital code based on the comparison;
   (d) increasing the oscillator frequency based on the second digital code;
   determining that the oscillator frequency is greater than the reference frequency, and in response to the determining:
   (e) generating a third digital code based on the comparison;
   (f) decreasing the oscillator frequency based on the third digital code;
   determining that the oscillator frequency is substantially the same as the reference frequency, and in response to the determining:
   (g) generating a fourth digital code based on the comparison;
   (h) neither increasing nor decreasing the oscillator frequency based on the fourth digital code; and
   repeating steps (a) through (d) or (a), (b), (e), (f), if the oscillator frequency does not substantially match the reference frequency.

8. A system for automatically trimming an oscillator, comprising:
   means for comparing the oscillator frequency with a reference frequency and for generating a first output signal based on a result of the comparison;

means for generating three different types of comparator output signals based on the first output signal, including a first comparator output signal indicating that the oscillator frequency is faster than the reference frequency, a second comparator output signal indicating that the oscillator frequency is slower than the reference frequency, and a third comparator output signal indicating that the oscillator frequency is substantially the same as the reference frequency; and means for providing one or more digital codes for trimming the oscillator based on whether the oscillator frequency is faster, slower or substantially the same as the reference frequency.

9. The system of claim 8, further comprising:
means for trimming the oscillator based on a digital code.

* * * * *